United States Patent [19]
Pollock et al.

[11] Patent Number: 6,082,297
[45] Date of Patent: Jul. 4, 2000

[54] ENCAPSULATED THERMOFOIL HEATER APPARATUS AND ASSOCIATED METHODS

[75] Inventors: John D. Pollock, Rowley; John W. Vanderpot, Boxford, both of Mass.

[73] Assignee: Novellus Sytems, Inc., San Jose, Calif.

[21] Appl. No.: 08/955,346

[22] Filed: Oct. 21, 1997

Related U.S. Application Data

[60] Provisional application No. 60/058,595, Sep. 12, 1997.

[51] Int. Cl.$^7$ .................................................. C23C 16/00
[52] U.S. Cl. ............................................................. 118/725
[58] Field of Search ..................... 118/724, 725; 156/345

[56] References Cited

U.S. PATENT DOCUMENTS

| | | | |
|---|---|---|---|
| 5,306,895 | 4/1994 | Ushikoshi et al. | 219/385 |
| 5,595,241 | 1/1997 | Jelinek | 165/80.1 |
| 5,688,331 | 11/1997 | Aruga et al. | 118/725 |

*Primary Examiner*—Richard Bueker
*Assistant Examiner*—Erin Fieler
*Attorney, Agent, or Firm*—Duft, Graziano & Forest, PC

[57] ABSTRACT

An encapsulated heater heats a susceptor within a process module such as for use in CVD, PVD and etch. The heater includes an electrically resistive heating element, e.g., an Inconel trace, that is responsive to applied voltage to radiate heat. A hermetically-sealed HASTELLOY C-22 or stainless steel 304 housing enclosing the element. An inert gas is disposed within the housing at a prescribed pressure, e.g., 150 Torr, for transferring thermal energy from the element to the housing and for preventing oxidation of the heating element. The prescribed pressure reduces differential pressure between inside and outside of the housing while maintaining sufficient thermal conduction through the gas such that the housing radiates and conducts heat the susceptor. A feed-through within the housing can be used to connect the heating element to a voltage source while maintaining the hermetic seal of the housing. Preferably, the resistive element is surrounded with an insulator, e.g., mica, to electrically isolate the resistive element from the housing. A pinch-off tube facilitates injecting the gas within the housing and for sealing the gas therein. The heater is replaceable as a unit within the susceptor to facilitate the manufacturing process in the event of a heater failure.

38 Claims, 13 Drawing Sheets

ENCAPSULATED THERMOFOIL HEATER APPARATUS AND ASSOCIATED METHODS

RELATED APPLICATIONS

This application is a continuation-in-part of U.S. Provisional application No. 60/058,595 filed on Sep. 12, 1997, which is herein incorporated by reference.

FIELD OF THE INVENTION

The invention relates to chemical and physical vapor deposition and etch reactors; and in particularly the construction and method of making heating elements within the susceptors of such reactors.

BACKGROUND OF THE INVENTION

It is well-known that the processes of chemical vapor deposition ("CVD"), physical vapor deposition ("PVD") and plasma etch occur within a reactor. One exemplary prior art reactor is described in U.S. Pat. No. 5,273,588, entitled "Semiconductor wafer processing reactor apparatus comprising contoured electrode gas directing means." Typically, the reactor of the prior art has an outer chamber which surrounds a pair of electrodes driven by a radiofrequency ("RF") source. The electrodes and source, in combination, generate a discharge between the electrodes to ionize reactive gases therein. These ionized gases form a "plasma" which deposits film onto, or etches film off of, surfaces in contact with the plasma.

In plasma CVD, for example, a workpiece, e.g., a semiconductor wafer, is clamped to one of the electrodes so that selected films can be deposited onto the workpiece's surface (s) exposed to the plasma between the electrodes. Successive exposures to differing plasmas can create desirable semiconductor films on the surface, such as a bilayer of titanium and titanium-nitride. Similarly, in plasma etch, coatings or films can be removed selectively when exposed to plasmas formed by appropriate etch gases, e.g., carbon tetrafluoride.

Because it is often desirable to heat the workpiece during the CVD or PVD process, one of the electrodes (usually the one that the wafer rests upon) also generally functions as a heated carrier or "susceptor". Accordingly, the heated electrode must be monitored and controlled to maintain electrode temperatures during film deposition or etch. Such control is particularly challenging in order to attain the desired accuracies of +/- two degrees, or less, for electrodes of up to seven hundred degrees Centigrade.

In the prior art, the heated electrode is generally formed by implanting a heating cable within the electrode. FIG. 1 illustrates one prior art reactor 10 configured with a heated metal susceptor 12. A wafer 14 is illustratively shown connected to the heated susceptor 12 and between the gap 16 formed by the susceptor 12 and the second electrode 18. The drive electronics, including the RF generator, are not shown for clarity of illustration.

The heated susceptor 12 forms a hollow interior 12a and includes a backplate 22 and a cable heater 20, each described in more detail in connection with FIGS. 1A, 1B and 1C. Because the chamber walls 11 of the reactor 10 enclose the electrodes 12, 18 within a low evacuated pressure (denoted as "[VACUUM]"), the susceptor 12 connects to a shaft 24 that extends out of reactor 10 and that couples ambient pressure (denoted as "[ATM]") to the interior 12a. Metal seals 26 properly seal the shaft 24 to the susceptor 12. A metal bellows 28 connects the walls 11 to the shaft 24 in order to provide for vertical movement of the shaft 24 and susceptor 12 along direction 31. The seals 30 connect between the walls 11 and the bellows 28 so as to maintain vacuum within the reactor 10. The cable heater 20 connects to drive electronics external to the reactor 10 and through the shaft 24 by way of cable leads 32.

FIG. 1A shows a cross-sectional and cut-away side view of the heated susceptor 12 of FIG. 1. The susceptor casing 12b connects with the backplate 22 and forms a series of conduits 12c for the cable heater 20. More particularly, the backplate 22—shown in a top view in FIG. 1B—and susceptor casing 12b are machined so as to provide a conduit 12c for the cable heater 20. As illustrated, the cable heater 20 is typically coiled and formed into a desired pattern matching the conduit 12c machined into the backplate 22 and casing 12b. The cable heater 20 connects to the cable leads 32 (shown only in FIG. 1) via through-holes 22a. A typical, straight cable heater 20' is shown as a section view in FIG. 1C. As illustrated, the cable heater 20' includes an outer metal casing 20a, a coiled active wire 20b, and an insulating powder 20c, e.g., MgO, that packs the wire 20b within the casing 20a.

Those skilled in the art are familiar with cable heaters and electrodes such as the cable 20 and susceptor 12. In operation, the wire 20b within cable 20' is heated when connected to electrical energy. The electrically insulating powder 20c is thermally conductive so that the thermal energy from the wire 20b transmits to the casing 20a, which radiates heat to the backplate 22 and susceptor 12. Note that, unlike the illustrated susceptor 12 and cable heater 20, FIG. 1A, operational susceptors have filaments that are coiled tightly within the susceptor so as to ensure uniform heating of the workpiece, e.g., the wafer 14 of FIG. 1. The cable heater 20 and susceptor design shown in FIGS. 1–1C are shown with reduced complexity for purposes of illustration.

The susceptor 12 of FIGS. 1 and 1A is typically constructed from stainless steel or stainless-covered copper. It is limited, in the prior art, to metal for reasons of vacuum sealability. Even the seals are typically made from metal. The relatively thick construction of the susceptor 12 is thus costly and leads to a high thermal mass, increasing the time required to heat the susceptor. It further results in poor thermal conductivity and leads to certain non-desirable thermal non-uniformities.

Other problems exist within the design of FIG. 1. First, major disassembly of the system 10 and susceptor 12 is required to replace the heater 20 in the event of failure. Accordingly, the repair time is long; and the associated cost to the production line is relatively high. Secondly, the feeds to the susceptor 20 are forced to come through a hollow shaft 24. Such a design is very constricting and leaves little room for even minor use or constructional modifications. Finally, because of the poor conductivity of susceptor 12, the heater 20 is more likely to fail because it must operate at higher temperatures in order to maintain the susceptor's surface temperature at the desired level.

FIG. 2 illustrates another prior art reactor 40 with a different heated susceptor configuration 42. A cable heater 44, like the one described above, is wound within the machined susceptor top plate 42a and against the backplate 42b. The susceptor 42 is suspended within the reactor 40 by way of the mount 50. The susceptor 42 is held within a vacuum, so the cable heater 44 is connected to drive electronics via hermetic electrical terminals 46, known to those skilled in the art. The terminals 46 connect to lead wires 47 which pass though the reactor wall 40a by way of vacuum electrical feed-through 48. For purposes of clarity, other reactor components are not illustrated, such as the second electrode and supporting electronics.

FIG. 3 illustrates another prior art reactor 60 with a different heated susceptor configuration 62. The susceptor 62 includes a thermofoil heater 62a—described in greater detail below—that mounts between a susceptor casing 62b and a susceptor backplate 62c. The susceptor 62 is suspended within the reactor 60 by way of the mount 66. The susceptor 62 is held within a vacuum, so the thermofoil heater 62a is connected to heater lead wires 68 which pass though the reactor wall 60a by way of vacuum electrical feed-through 70. As in FIG. 2, other reactor components are not illustrated for purposes of clarity, such as the second electrode and supporting electronics.

Heating susceptors configured as in FIGS. 2 and 3 are particularly subject to failure because of any of the following conditions: contamination, corrosion, over-heating, and dielectric breakdown. With regard to FIG. 2, for example, the heater elements—i.e., the cable heater 44, and the plates 42a, 42b—are held within VACUUM and are exposed directly, or even indirectly, to processing environments which can be especially harsh, including reactive RF plasmas and corrosive gases. The heater 44 is further exposed, at times, to aggressive CVD or cleaning chemistries that can attack the heater 44. After prolonged exposure, the heater 44 becomes seriously contaminated with unwanted residue. Further, because the cable 44, terminals 46 and lead wires 47 are directly exposed to the environment within reactor 40, over time the dielectrics associated with these elements become metalized by CVD processes, or become corroded by process chemistries, and are thus subject to failure. The heater 44 must also operate at high temperatures in order to overcome the thermal transfer inefficiency of the evacuated environment within the chamber and to heat the susceptor 42. It is thus more likely to fail when forced to operate at higher temperatures.

FIG. 3A shows a cross-sectional view of the thermofoil heater 62a, which includes two boron nitride discs 70a, 70b as electrical insulators about an Inconel trace element 70c. A boric oxide adhesive 71 binds the two discs together. Note that the trace element 70c is in reality wound tightly within the susceptor 62 in a pattern machined into the discs 70a, 70b.

In addition to certain of the problems described above in connection with FIG. 2, the reactor 60 has other problems. The thermofoil heater 62a and lead wires 68 are directly exposed to the reactor 60 environment, and are prone to failure due to the corrosion and/or metalization. The Inconel trace 70c can also evaporate in a vacuum, creating contamination by re-depositing on cooler surfaces or causing dielectric breakdown of the insulating boron nitride by re-deposition on the insulators. Other elements, e.g., leadwires and insulating discs 70a, 70b, are also in the evacuated pressures and can cause additional outgassing and contamination of the process environment. The evaporation of the Inconel trace 70c further reduces the cross-sectional area of the trace, thereby increasing resistance and creating "hot" spots: hot spots can cause thermal non-uniformities and accelerate the failure of the trace 70c which can eventually cause an electrical "open" or short-circuit of the heater 62a. CVD processes also can metalize the discs 70a, 70b and leadwire insulation, leading to heater current leakage and eventual short-circuiting. Finally, the nitride discs 70a, 70b tend to create particulates, and thus unwanted contamination within the reactor 60.

Accordingly, there is the need to prolong the life of the heated electrode and associated heating elements; and to make reactor operation continually efficient over time. It is thus one object of the invention to provide a heating susceptor which reduces, or eliminates, the problems associated with prior art heating electrodes. Other objects of the invention will be apparent from the description which follows.

SUMMARY OF THE INVENTION

The following U.S. Patents provide useful background to the invention and are accordingly incorporated herein by reference: U.S. Pat. No. 5,273,588; U.S. Pat. No. 4,522,149; U.S. Pat. No. 4,632,057; U.S. Pat. No. 4,503,807; U.S. Pat. No. 3,796,182; U.S. Pat. No. 5,261,960; U.S. Pat. No. 5,558,717; U.S. Pat. No. 5,425,812; U.S. Pat. No. 5,574,247; U.S. Pat. No. 4,933,203; and U.S. Pat. No. 5,565,036.

In one aspect, the invention includes an encapsulated heater for heating a susceptor within a process module. The heater includes an electrically resistive heating element that is responsive to applied voltage to radiate heat. A hermetically-sealed housing encloses the element. A gas is disposed within the housing at a prescribed pressure to transfer thermal energy from the element to the housing and to prevent oxidation of the heating element. The prescribed pressure reduces differential pressure between inside and outside of the housing while maintaining sufficient thermal conductivity through the gas such that the housing radiates and/or conducts heat to the susceptor. Accordingly, the pressure is optimized between higher pressure, which increases thermal heat transfer through the gas, and lower pressure, which reduces the pressure differential through the housing and which reduces stress and bending of the housing. A prescribed pressure of 150 Torr provides an approximate optimized value for typical CVD, PVD and plasma etch environments.

Preferably, the heater includes a feed-through within the housing to connect the heating element to a voltage source while maintaining the hermetic seal of the housing.

In one aspect, the resistive element includes an Inconel trace. However, the resistive element can also be made from an electrically resistant material such as nichrome, nickel-chromium, nickel-chromium-iron, nickel-chromium-aluminum alloy, molybdenum, platinum, tantelum, tungsten, silicon carbide, molybdenum disilicide and graphite.

In still another aspect, the heater includes an insulator to electrically isolate the resistive element from the housing. One suitable insulator is mica. Others include boron nitride, aluminum nitride and alumina. By way of example, mica can be formed into two layers of mica that sandwich the resistive element therebetween. Other insulating materials include ceramic or boron nitride, or electrically insulating laminates; so long as these materials can support the traces.

In a preferred aspect, the housing is made from metal that can be welded. Exemplary metals include, without limitation, 316L SS, 304L SS, Hastelloy, 304L SS coated with nickel.

In another preferred aspect, the gas is an inert gas such as helium, argon and nitrogen.

In still another aspect, a pinch-off tube connects to the housing to facilitate removing initial gases such as oxygen, injecting the gas therein, and sealing the gas within the housing.

In another aspect, electrical lead-outs connect to the heating element and feedthroughs connect the lead-outs through the housing to an external voltage source. By way of example, the feedthroughs can include flexible hermetic metal bellows with a proximal end connected with the housing and a distal end connected with external electrical connections. An electrical end connector can be coupled to the distal end.

In still another aspect, the invention provides a heating susceptor for heating a workpiece within a processing chamber. A susceptor structure has a substantially flat top, to support the workpiece within the chamber, and a hollow interior. A heater is disposed within the interior. The heater has a housing and an electrically resistive element hermetically sealed within the housing. The element is responsive to applied voltage to radiate heat within the housing. A gas (preferably an inert gas) is disposed within the housing to transfer thermal energy from the element to the housing thereby heating the interior.

In a preferred aspect, the susceptor structure is constructed and arranged with an aperture sized to permit installation and replacement of the heater within the interior. Accordingly, a cover is provided, in another aspect, to substantially fill the aperture so that the cover and structure substantially enclose the heater within the interior.

Preferably, the susceptor structure and cover are formed of substantially the same material. In one aspect, the material has an emissivity of at least 0.9. In another aspect, the material has a thermal conductivity of at least 100 W/m-°C. In still another aspect, the material has a thermal coefficient of expansion of at most $3 \times 10^{-6}/°C$. One suitable material for the susceptor structure (and cover) is silicon carbide coated graphite. The susceptor structure can also be made from Hastelloy or other nickel-based alloys (to resist corrosion) such as Alloy, Alloy 230, Alloy C-22, Alloy 600, Alloy C-276, Alloy 601, Alloy G3, Alloy 617, Alloy HX, Alloy 625, Alloy S, Alloy 690, Alloy W, Alloy 718, Alloy X, Alloy X750, Alloy 751, and Alloy MA 754.

As before, the heating element can include an Inconel trace or other resistive element made from electrically resistant material, e.g., nichrome, nickel-chromium, nickel-chromium-iron, nickel-chromium-aluminum alloy, molybdenum, platinum, tantalum, tungsten, silicon carbide, molybdenum disilicide and graphite.

In still another aspect, the heating susceptor includes an insulator such as mica (or boron nitride, aluminum nitride and alumina) to electrically isolate the resistive element from the housing. In another aspect, two layers of mica sandwich the resistive element therebetween.

In one aspect, the gas pressurizes within the housing to a prescribed pressure which reduces differential pressure between inside and outside of the housing while maintaining sufficient thermal conductivity through the gas wherein the housing radiates heat to heat the structure. By way of example, one acceptable prescribed pressure is about 150 Torr for typical CVD, PCD and plasma etch processes.

These and other aspects and advantages of the invention are evident in the description which follows and in the accompanying drawings.

BRIEF DESCRIPTION OF THE DRAWINGS

A more complete understanding of the invention may be obtained by reference to the drawings, in which.

DETAILED DESCRIPTION OF THE INVENTION

Figure 4:
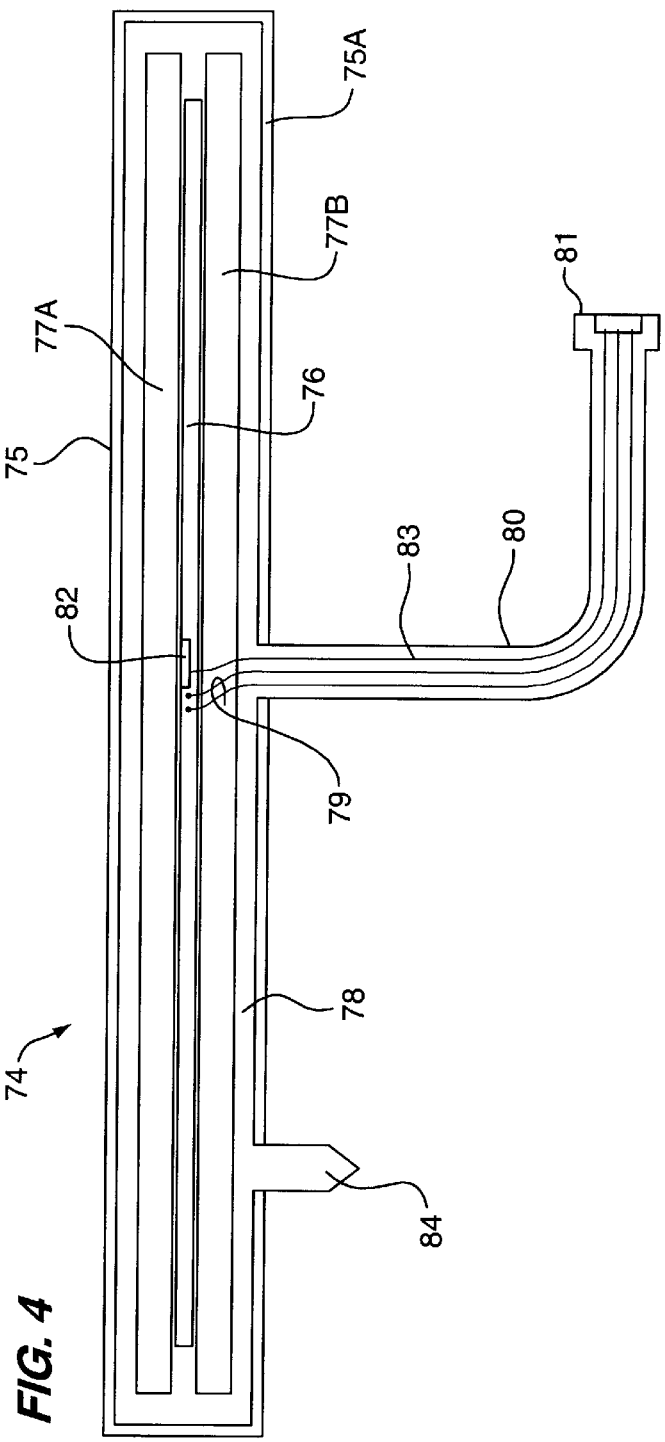
FIG. 4 illustrates a cross-sectional view of an encapsulated heater constructed according to the invention.

FIG. 4 shows, in a cross-sectional view, an encapsulated heater 74 constructed according to the invention. Generally, the heater 74 includes an outer encasement 75, an inner resistive element 76 (e.g., an Inconel trace), surrounding electrical insulators 77a, 77b (e.g., mica sheets), and a conductive gas 78 (e.g., an inert gas such as helium) within the encasement 75. Electrical lead-out wires 79 connect to the element 76 and extend through a flexible hermetic cable 80 to the end connector 81. The wires 79 are used to drive the element 76 to generate heat within the encasement 75. The cable 80 thus connects the heater 74 to a voltage source (not shown). Preferably, the heater 74 also includes a thermocouple 82 connected to the element 76; and a thermocouple sensing wire 83 connects to the thermocouple 82 and through the cable 80 so that users can monitor the temperature of the element 76 for control thereof through the source.

The encasement 75 is preferably made from metal that can be welded. Exemplary metals include, without limitation, 316L SS, 304L SS, Hastelloy, 304L SS coated with nickel. Hastelloy can also be used as well as nickel-base alloys such as Alloy, Alloy 230, Alloy C-22, Alloy 600, Alloy C-276, Alloy 601, Alloy G3, Alloy 617, Alloy HX, Alloy 625, Alloy S, Alloy 690, Alloy W, Alloy 718, Alloy X, Alloy X750, Alloy 751, and Alloy MA 754.

Figure 1:
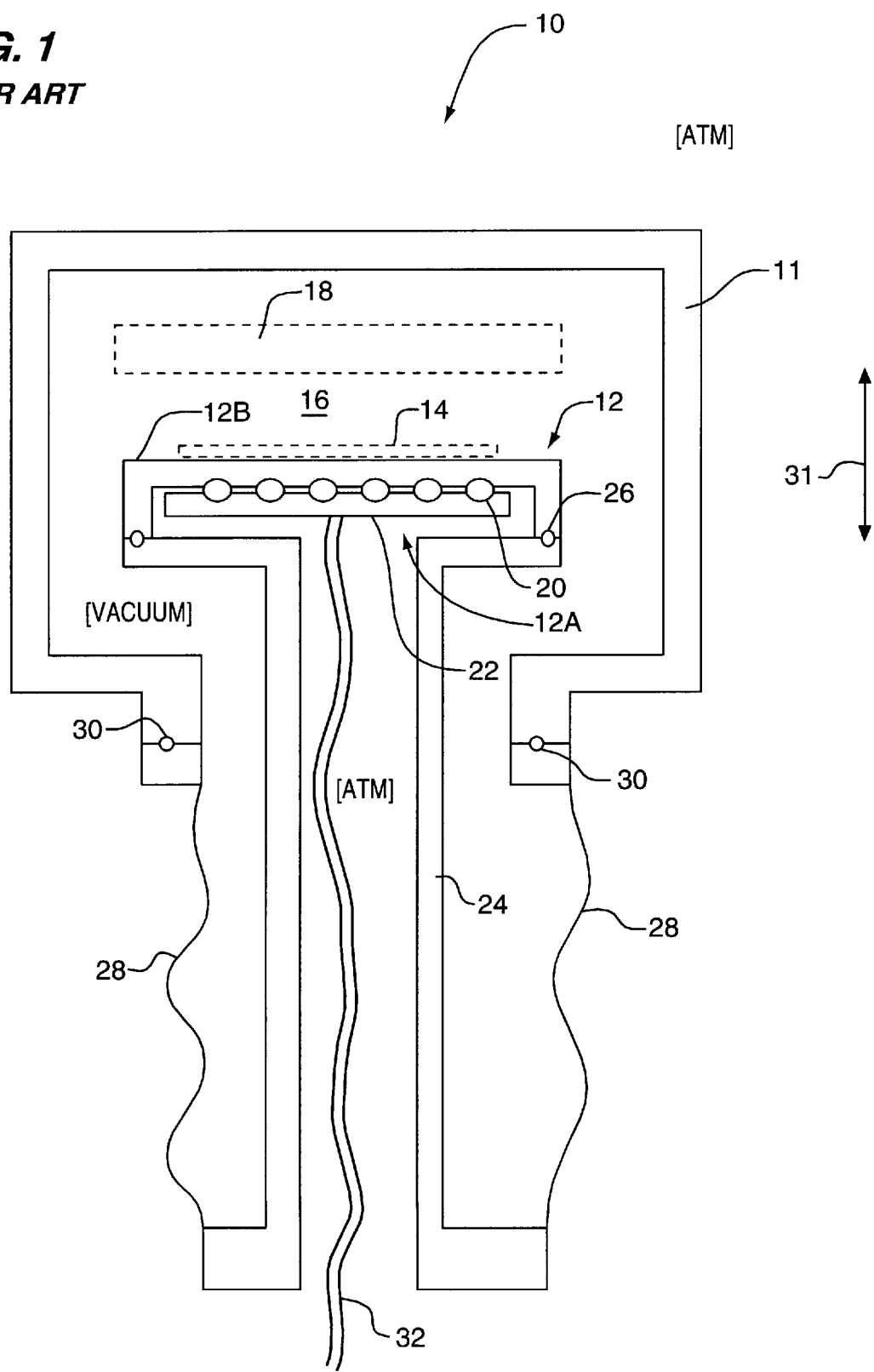
FIG. 1 illustrates a cross sectional view of a prior art reactor and heated electrode.
Figure 1A:
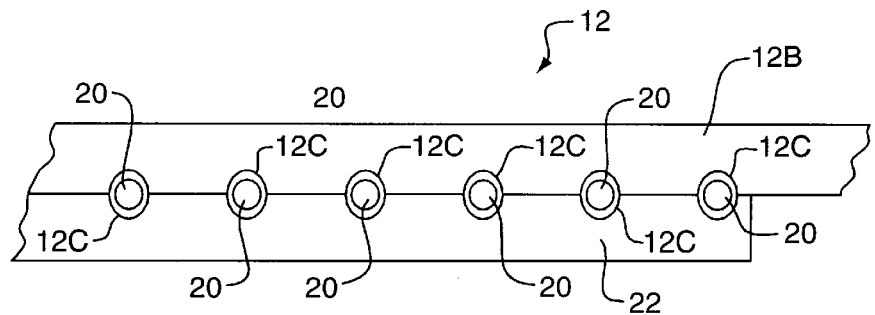
FIG. 1A shows, in a cross-sectional and partially cut-away view, greater detail of the heated electrode of FIG. 1.
Figure 1B:
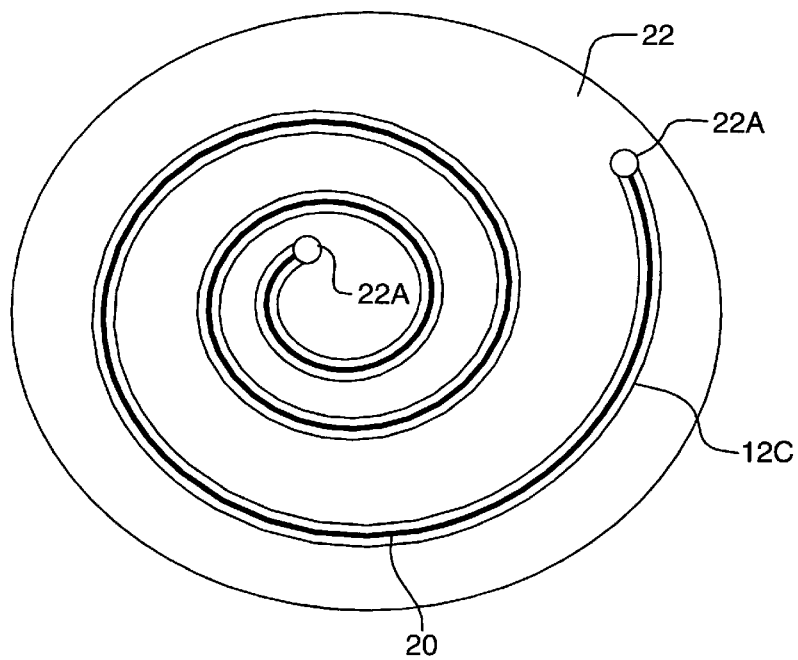
FIG. 1B shows a top view of the backplate and heater cable as elements of the electrode of FIG. 1.
Figure 1C:
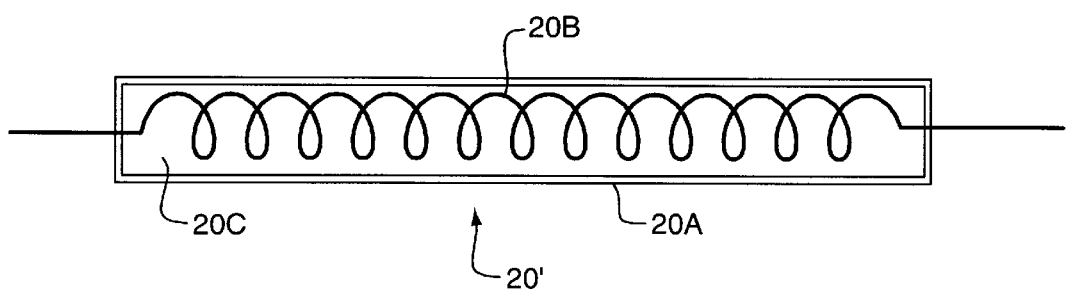
FIG. 1C shows greater detail of a heater cable such as illustrated in FIGS. 1A and 1B.
Figure 2:
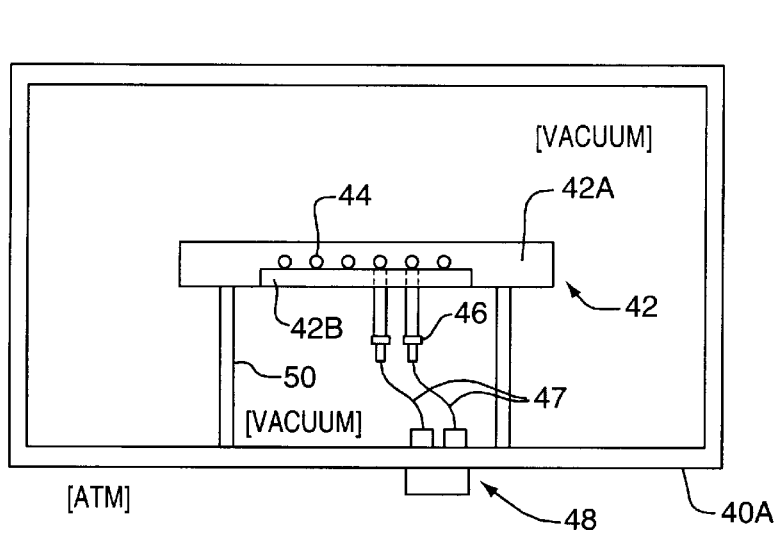
FIG. 2 illustrates a cross-sectional view of another prior art reactor, including a heated electrode connected to hermetic electrical terminals.
Figure 3:
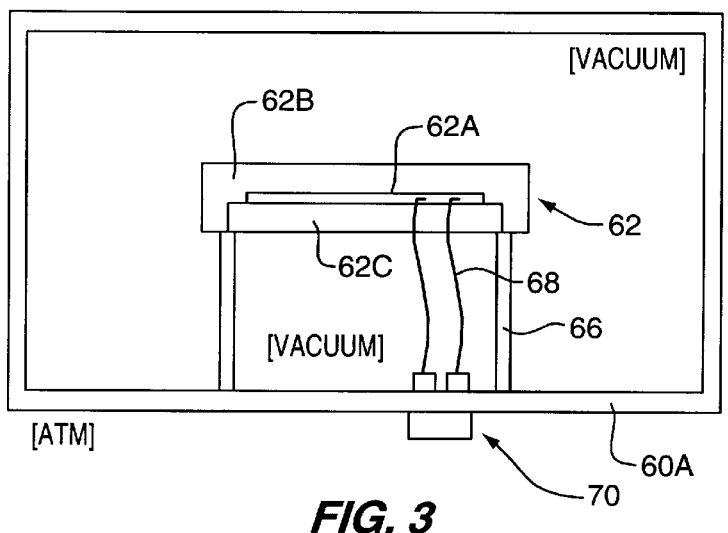
FIG. 3 illustrates a cross-sectional view of another prior art reactor, including a heated electrode and an enclosed thermofoil heater.
Figure 3A:
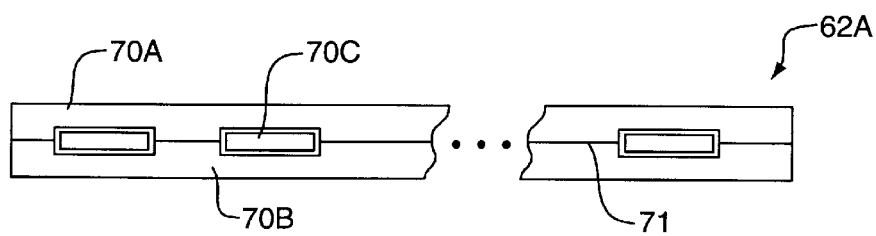
FIG. 3A shows further detail of the thermofoil heater of FIG. 3.
Figure 4A:
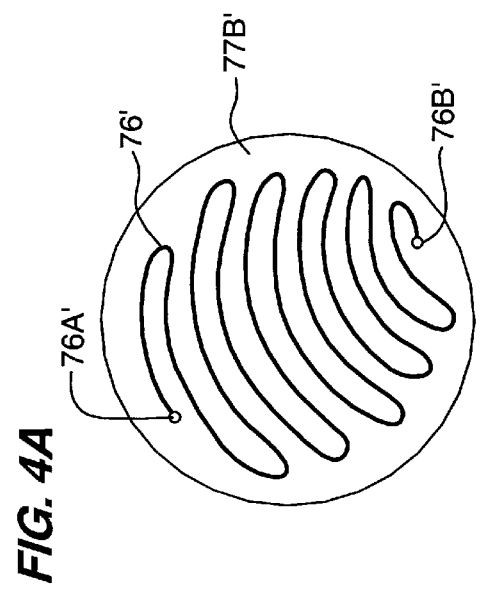
FIG. 4A illustrates a top view of an Inconel trace on a mica insulator.

The resistive element 76 is shown simply and not-to-scale for purposes of illustration. In reality, however, the element 76 is preferably a patterned, lithographically formed Inconel trace that is less than typically between 0.002 inch and 0.005 inch thick. The insulators 77 are larger, typically 0.010 inch to 0.020 inch thick. After formation, the trace is lifted, sandwiched and bonded between the insulators 77. The Inconel trace and the method of constructing the trace between insulators are known to those skilled in the art, such as illustrated in FIG. 3A above. FIG. 4A shows, for example, a top view of one representative element 76' formed into pattern and placed on one mica insulator 77b'. The element 76' can be sized and shaped with a particular heating outline and pattern density so as to generate certain spatial and temporal heating characteristics. The pattern of element 76' can be made from one continuous line with two ends 76a', 76b' that connect, respectively, to electrical lead-outs such as the wires 79 of FIGS. 1. Alternatively, the element 76' can include a series of patterned continuous lines, each with two ends for connection to electrical lead-outs and a power source. In either case, the element 76 generates resistive heat uniformly throughout the pattern when driven by a voltage source connected to the ends.

The encasement 75 is evacuated to remove residual gases such as oxygen, nitrogen and manufacturing by-products. The encasement 75 is filled with the thermally-conductive gas 78 (e.g., an inert gas) prior to use. A "pinch-off" tube 84 illustrates one technique that facilitates this process. That is, the encasement 75 is connected to a vacuum pump through a hermetic conduit connected with the tube 83; whereinafter the gas 78 is pumped into the encasement 75 and the tube 84 is pinched to hermetically seal the interior of the encasement 75. Those skilled in the art should appreciate that other techniques for evacuating the encasement 75 and for filling the encasement 75 with gas 78 are known and envisioned for use with the invention.

The pressure within the encasement 75 is preferably optimized so as to maximize heat transfer through the gas 78 but without substantial bending or stress on the encasement 75. As pressure increases, thermal conduction through the gas 78 increases; but the thickness of encasement wall 75a must be increased to prevent excessive bending. At the same time, increasing the wall 75a thickness lowers the thermal conduction through the encasement 75. There is thus a trade, or optimization, between maximizing heat transfer through the gas 78, minimizing stress and bending of the encasement 75, and maximizing thermal conduction of the encasement 75. One suitable pressure for this optimization is 150 Torr, where the encasement wall 75a is made from Hastelloy C22 at a thickness of 0.062 inch.

The insulators 77 electrically isolate the element 76 from the encasement 75 which might be subjected to electrical fields such as within a CVD reactor. Accordingly, the insulators 77 are preferably made from mica which is electrically insulating and which provides adequate support for the Inconel trace. Ceramics, boron nitride or other laminates can be used as replacement materials for the mica provided there is sufficient electrical insulation and support for the resistive element 76. One advantage within such construction is that mica has high dielectric strength and can be thin (i.e., 0.010–0.020 inch thick); therefore its thermal conduction is relatively high. In addition, mica is low in cost as compared to ceramics. Normally, mica can function well as an insulator and without damage up to approximately 590 degrees C.; and this temperature is potentially increased when surrounded by inert gas such as shown in FIG. 4. Accordingly, the heater 74 can be operated within process environments such as within chemical or thermal vapor deposition and etch modules.

Figure 5:
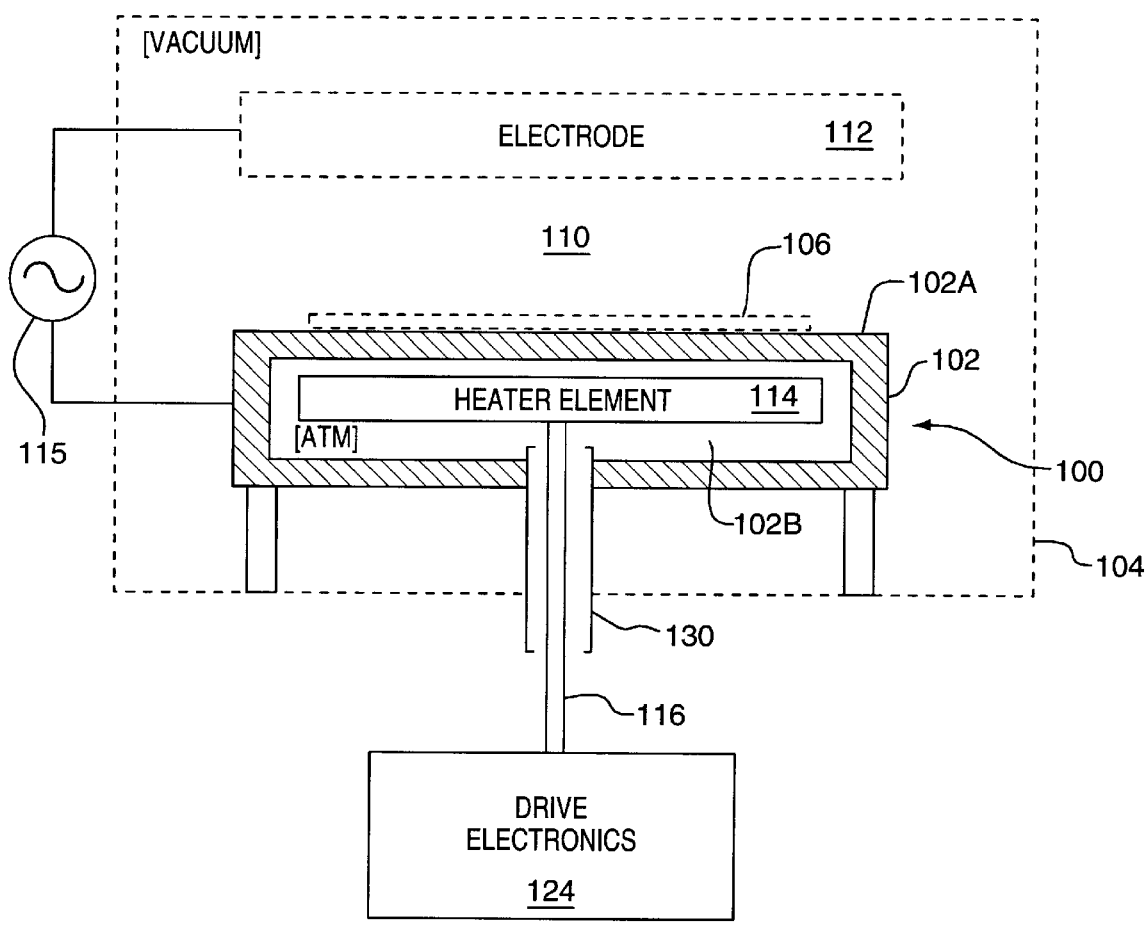
FIG. 5 illustrates a cross-sectional view of a heated susceptor constructed according to the invention and shown within a process chamber.

The heater 74 is particularly well-suited to replace the heating components within the heated susceptors shown in FIGS. 1–4. FIG. 5 illustrates, for example, a cross-sectional view of a heated susceptor 100 constructed with the encapsulated heater 114 of the invention. The susceptor 100 includes an electrode structure 102 which forms one of the electrodes within a processing chamber 104, e.g., a PVD chamber. The electrode structure 102 has a substantially flat top 102a for supporting the workpiece, shown illustratively as outline 106. The electrode structure 102 is suspended within the chamber 104 on top of mount 108 so as to form a gap 110 with the second electrode 112. The mount 108 is generally coupled to a linear drive subsystem (not shown), known to those skilled in the art, to raise and lower the susceptor 100 within the chamber 104.

In operation, the electrodes 102, 112 are coupled to an RF generator 115 to generate RF discharges within the gap 110. Such discharges are used in certain embodiments of the invention to ionize gas during plasma CVD.

The electrode structure 102b further forms a hollow interior 102b; and the heating element 114 is disposed within the interior 102b. The heating element 114, described above, is responsive to applied voltage to radiate heat within the interior 102b. In the embodiment of FIG. 5, the electrode structure 102 is connected, pressurewise, to ambient air external to the chamber 104. A conduit 130 connects with and through the electrode structure 102 such that the interior is hermetically sealed from environments 132 within the chamber 104. Electrical lead outs 116 connect directly from the heating element 114 through the conduit 130 and to external drive electronics 124.

Figure 6:
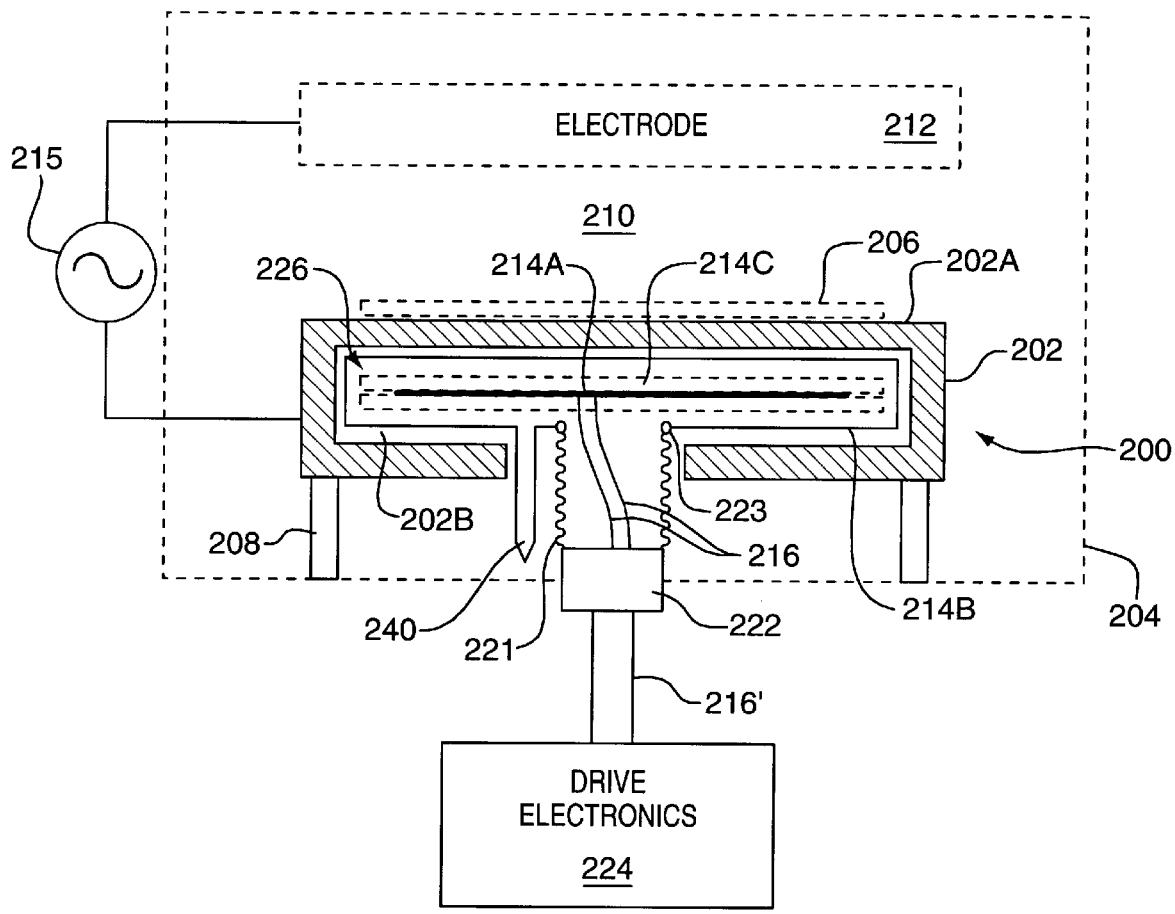
FIG. 6 illustrates a cross-sectional view of a second heated susceptor constructed according to the invention.

FIG. 6 shows a cross-sectional view of another heated susceptor 200 constructed according to another embodiment of the invention. As above, the susceptor 200 includes an electrode structure 202 which forms one of the electrodes within a processing chamber 204, e.g., a CVD chamber. The electrode structure 202 has a substantially flat top 202a for supporting the workpiece, shown illustratively as outline 206. The electrode structure 202 is suspended within the chamber 204 on top of mount 208 so as to form a gap 210 with the second electrode 212. As above, the mount 208 is generally coupled to a linear drive subsystem (not shown), known to those skilled in the art, to raise and lower the susceptor 200 within the chamber 204.

In operation, the electrodes 202, 212 are coupled to an RF generator 215 to generate RF discharges within the gap 210. Such discharges are used in certain embodiments of the invention to ionize gas during plasma CVD.

The electrode structure 202 further forms a hollow interior 202b; and a heating element 214, similar to the heater 74 of FIG. 4, is disposed within the interior 202b. The heating element 214 includes a resistive element 214a, and an enclosure 214b which surrounds to contain the element 214a therein. The enclosure 214b connects to a metal bellows 221 via weldings 223; and the bellows 221 further connects to a hermetic electrical feed-through 222 at the chamber wall 204.

The resistive element 214a is responsive to applied voltage to radiate heat within the enclosure 214b. Accordingly, the resistive element 214a couples to lead outs 216 which pass through enclosure 214b, through the interior of the bellows 221, and to the feed-through 222. After the feed-through 222, the lead outs 216' are in ambient and connect to drive electronics 224 external to the chamber 204 to drive the element with the desired voltages.

A thermally conductive inert gas 226 is disposed within the heater environment confined within the enclosure 214b and the bellows 221. The gas 226 is used to transfer thermal energy from the resistive element 214a to the enclosure 214b, thereby heating the electrode 202. A pinch-off tube 240 provides access to within the enclosure 214b; and that tube 240 is closed off once the inert gas 226 is injected within the enclosure 214b. As an alternative, ambient pressure can be coupled to within the enclosure 214b and bellows 221.

In a preferred embodiment of the invention, the heating element 214 further includes an electrical insulator 214c which insulates the resistive element 214a from enclosure 214b, and hence from the electrode structure 202. Further details of the heating element 214 are shown and described in connection with FIG. 4.

The susceptors described in connection with FIGS. 5 and 6 are preferably made from silicon carbide-coated graphite. This material provides excellent thermal uniformity that surpasses the metals used in the prior art susceptors. In addition, silicon carbide-coated graphite provides a lower thermal mass, thereby decreasing the time to heat the susceptor and to process parts therein, an advantage in production. The use of mica as an insulator within the heaters described above is also beneficial in several ways. First, mica is a dielectric rated to 590 degrees C., and thus generally covers the range of deposition and etch processes of the invention. Second, mica can be thin so as to reduce the temperature differences throughout the mica and yet to maintain electrical insulating capabilities.

Figure 7:
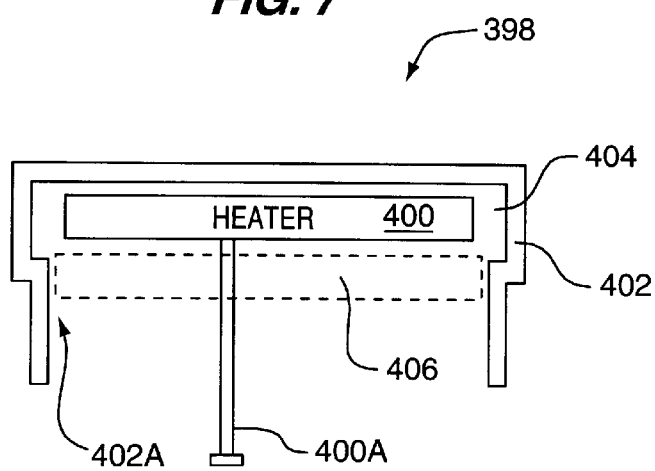
FIG. 7 illustrates a heated susceptor constructed according to the invention and configured for ease of replacement with the heating element of FIG. 4.

FIG. 7 illustrates a heating susceptor 398 constructed according to the invention. The susceptor 398 includes a susceptor structure 402 that forms a cavity 404 suitable for encasing the heater 400 (e.g., the heater 74 of FIG. 4). The structure 402 also forms an aperture 402a that is large enough to accommodate the heater 400 so that the heater 400 can be inserted and removed from the susceptor 398 as needed. A cable 400a and connector 400b provide for connecting the heater 400 to power. In this configuration, a failure of the heater 400 can be easily remedied by replacing the heater 400 and without replacement of the entire susceptor 398. A cover 406 is placed within the aperture 402a when the heater 400 is in place. The cover 406 should be of the same highly emissive material as the structure 402 so that the cavity 404 creates a very efficient blackbody cavity. Preferably, the material of the structure 402 and cover 406 has an emissivity of greater than 0.9, a thermal conductivity greater than 100 W/m-°C., and a coefficient of thermal expansion $\leq 3 \times 10^{-6}$/-°C. so as to provide high dimensional stability and radiative capacity. Silicon carbide and graphite are both preferred materials that can be used for the structure 402 and for the cover 406.

Figure 8:
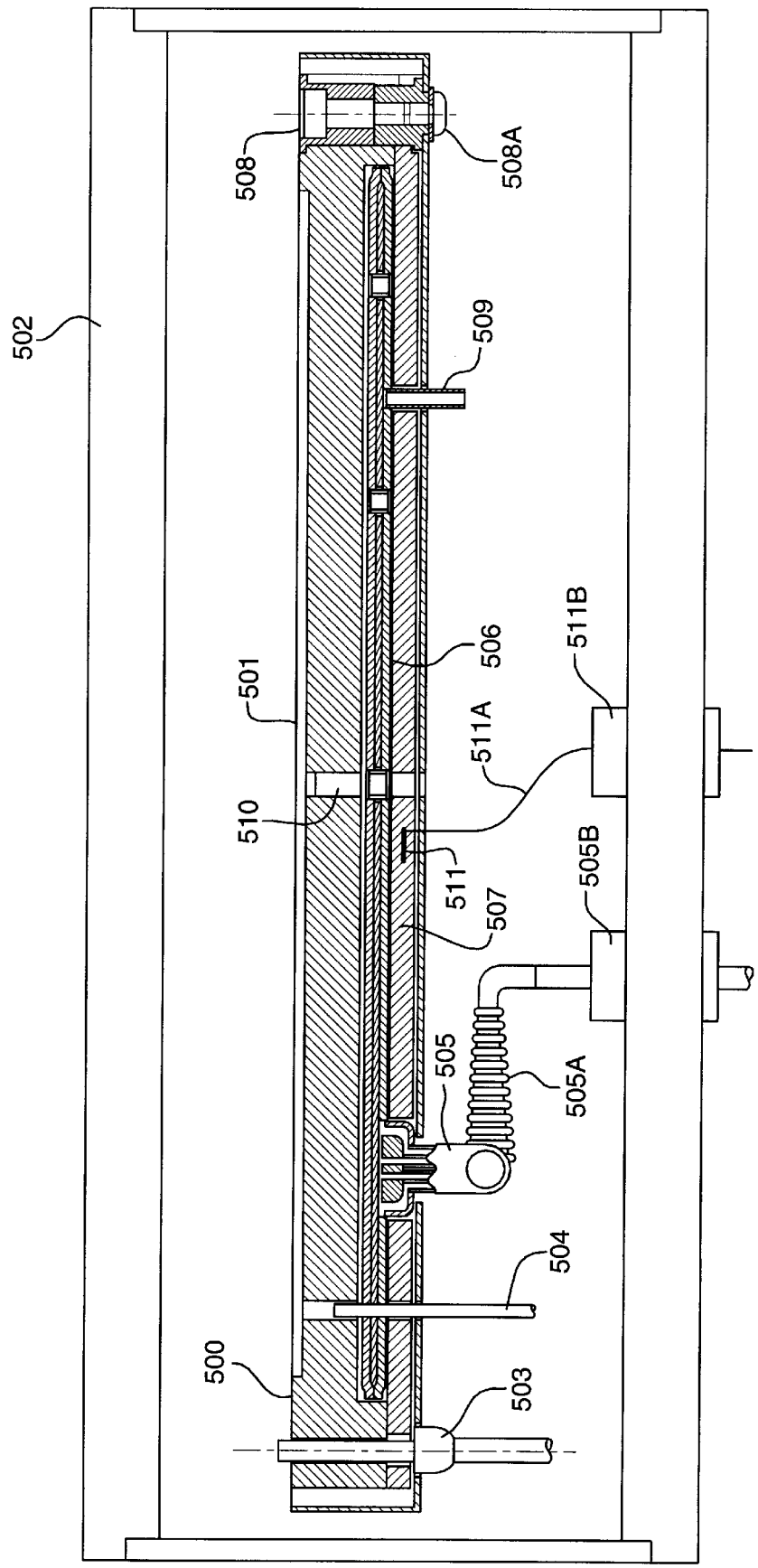
FIGS. 8–8E illustrate additional detail as to susceptors and cabling for heaters constructed according to the invention.
Figure 8A:
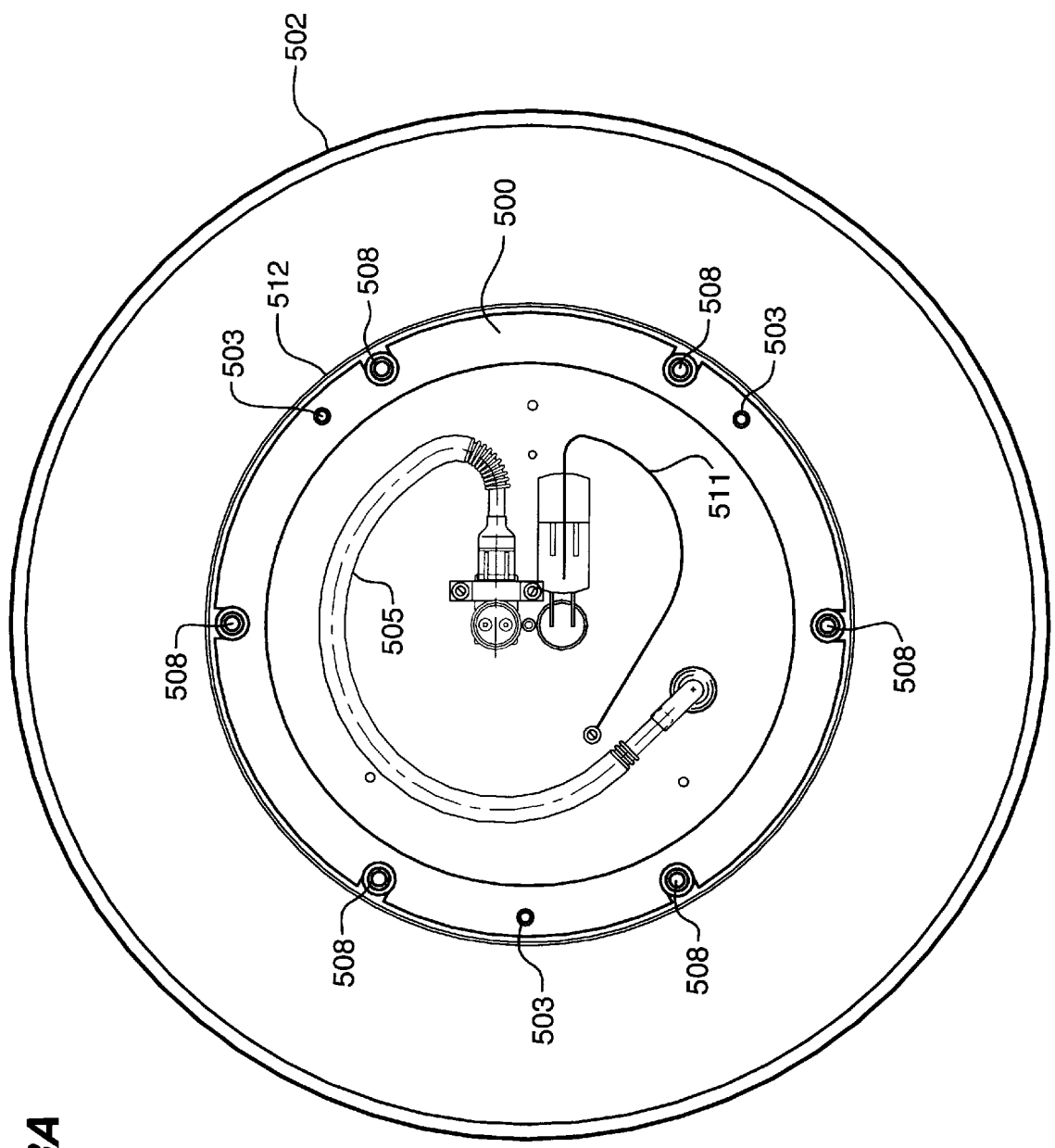
Figure 8B:
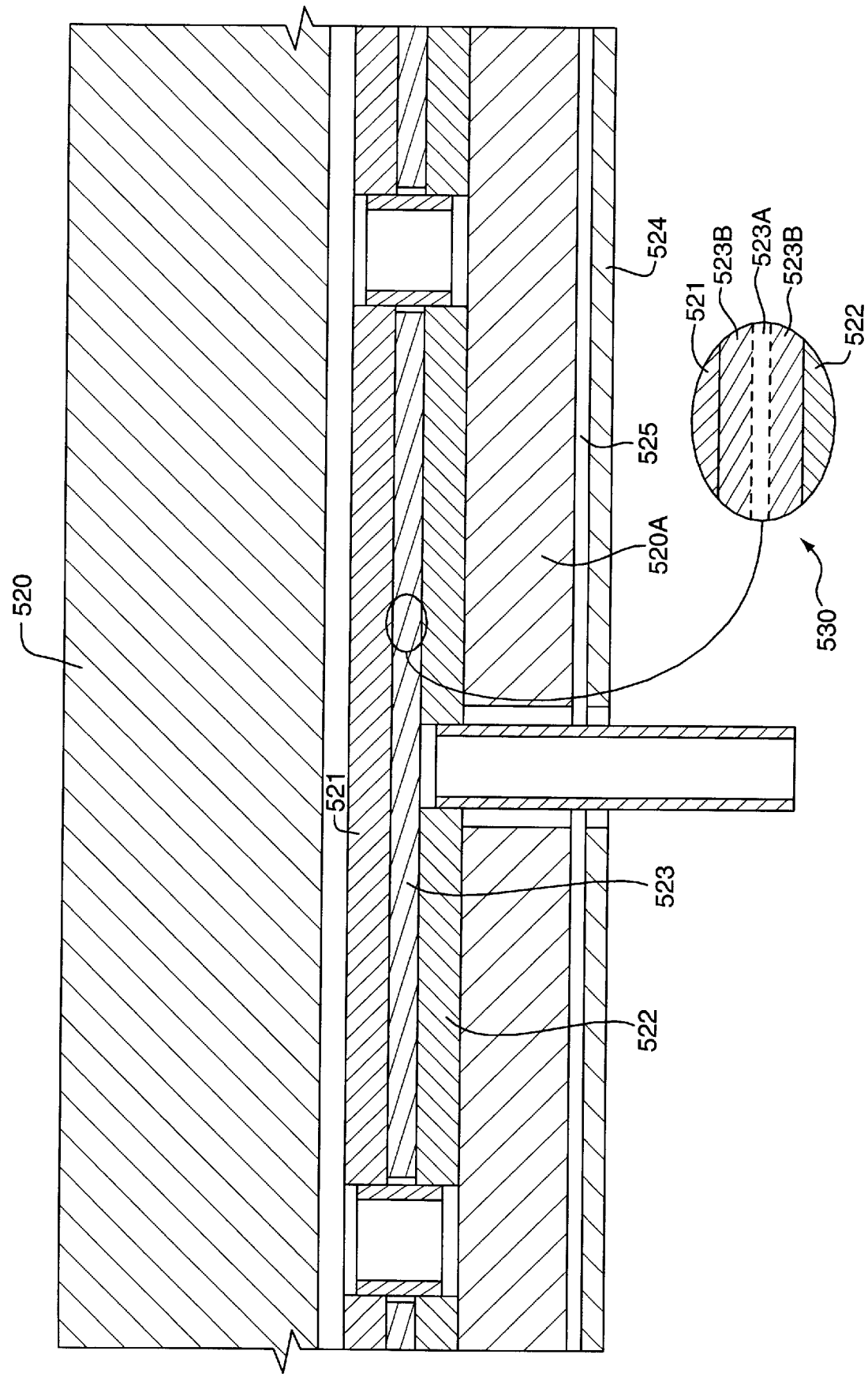
Figure 8C:
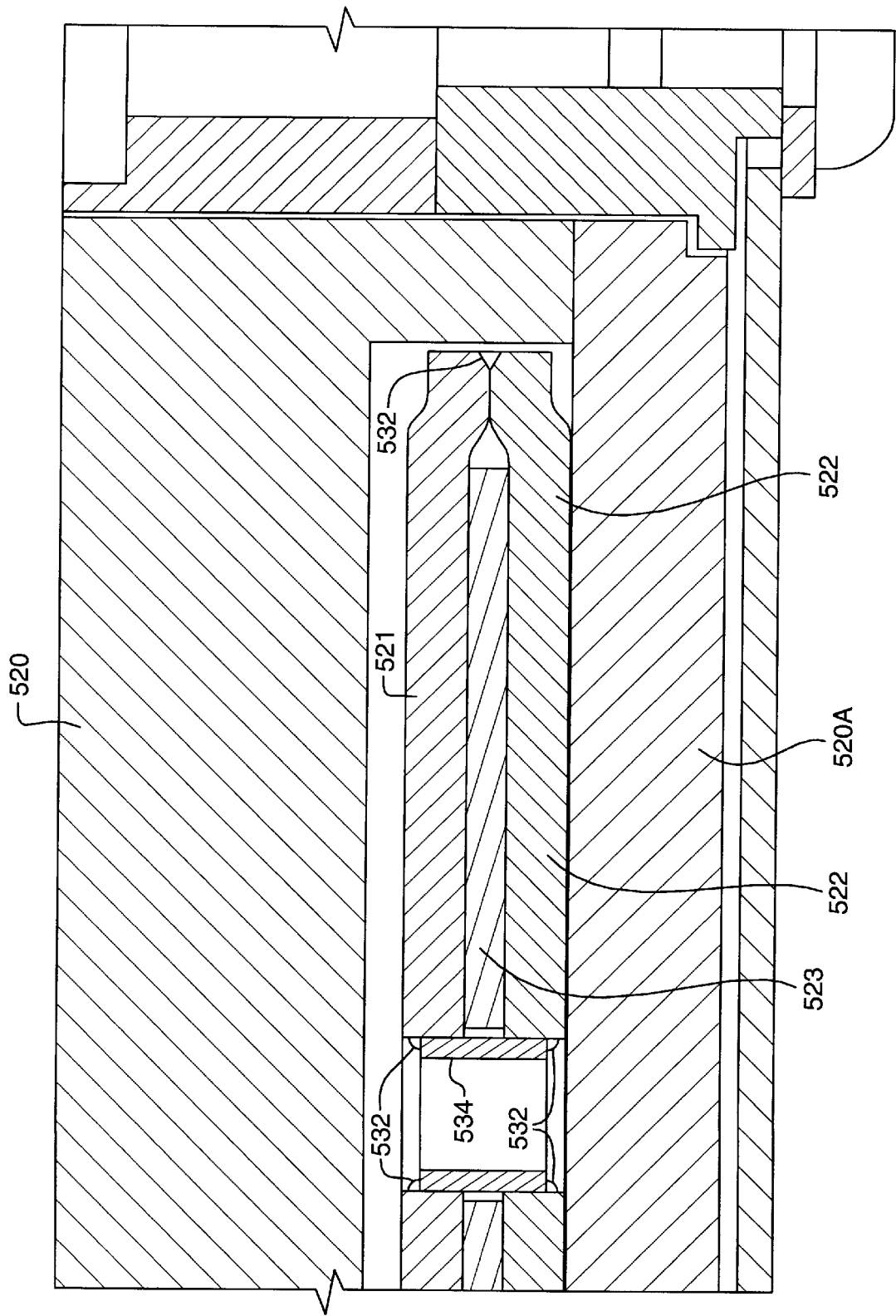
Figure 8D:
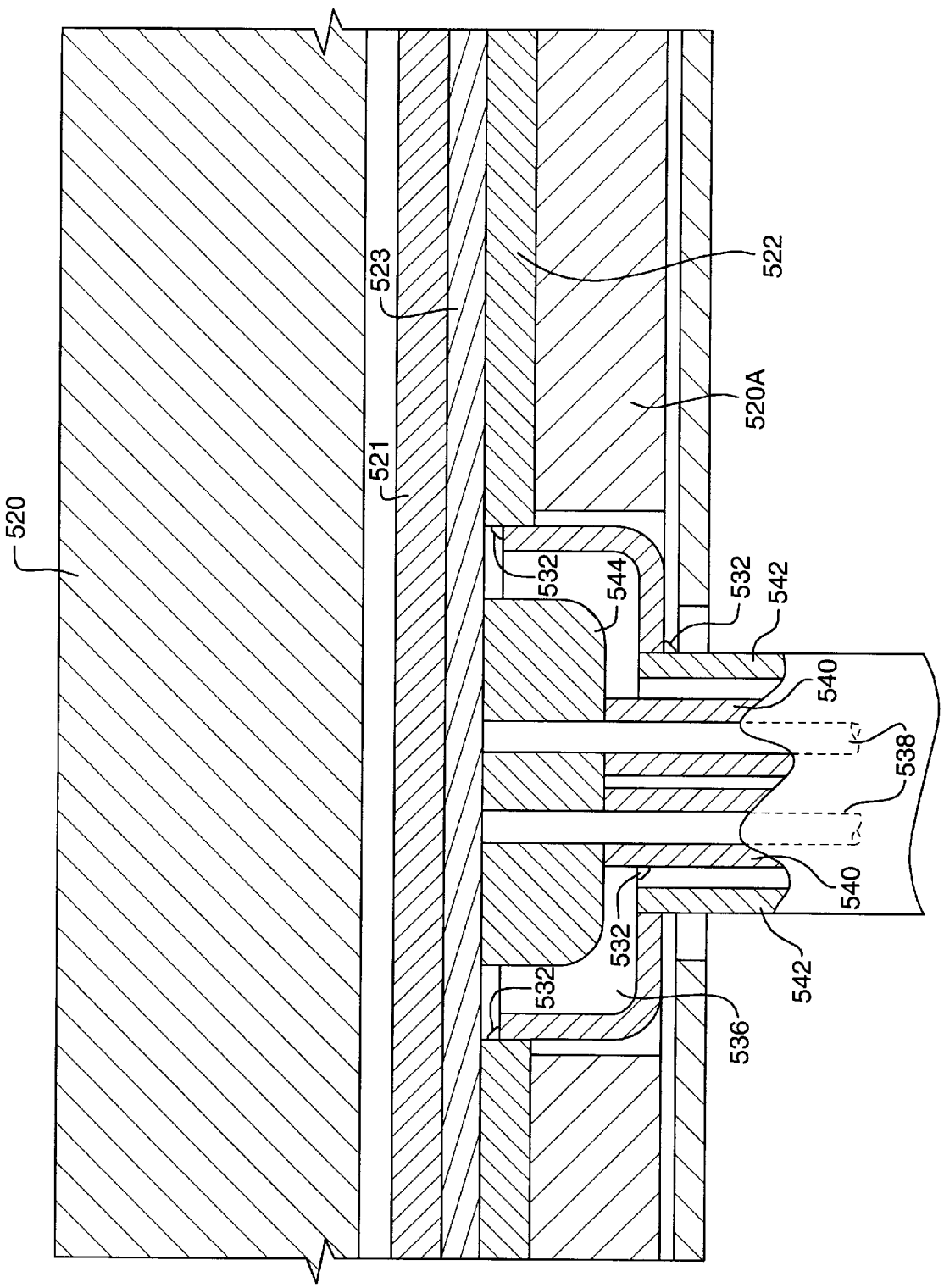
Figure 8E:
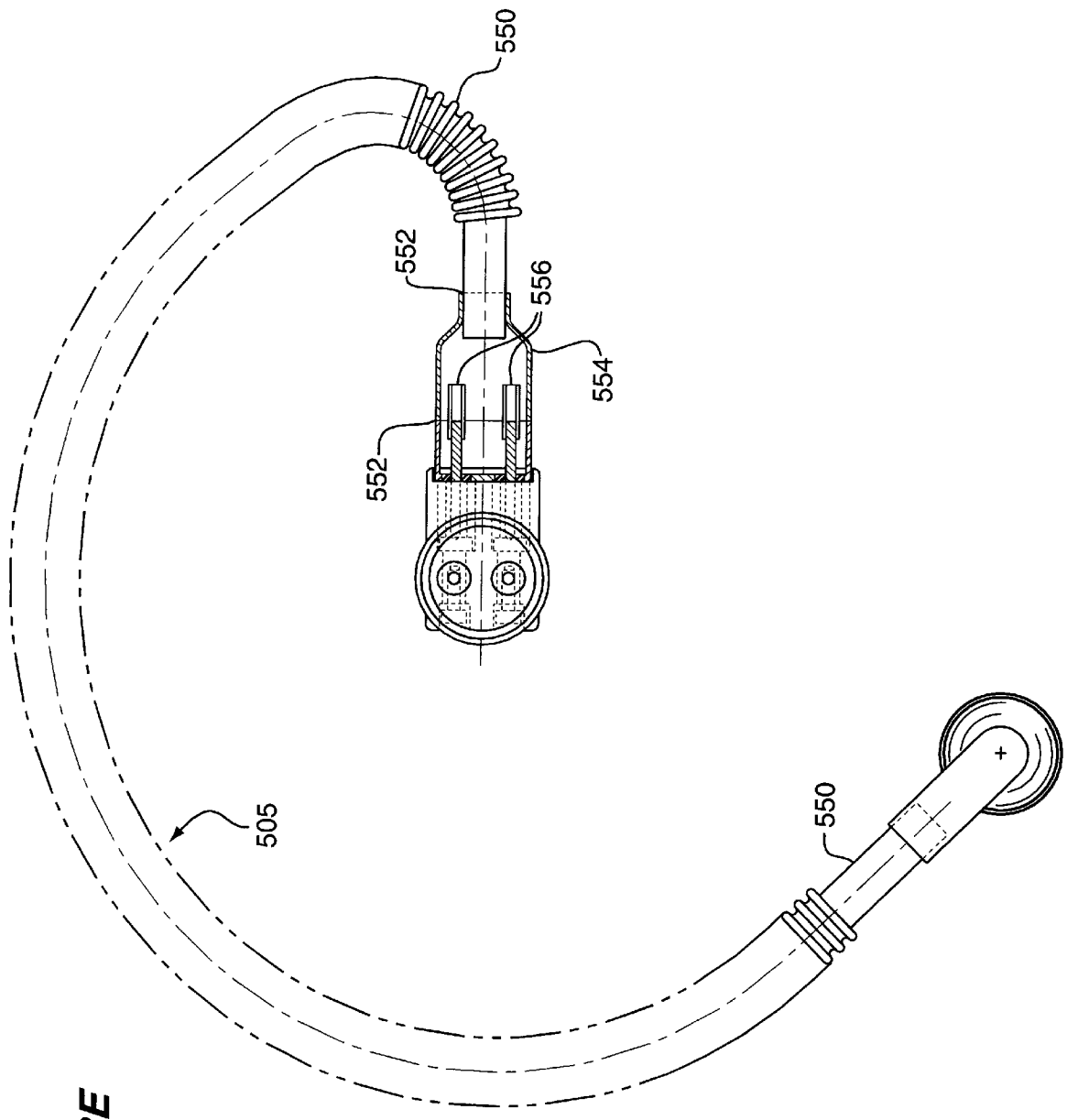

FIGS. 8–8E illustrate additional detail as to susceptors and cabling for heaters constructed according to the invention. FIG. 8 shows a cross-sectional side view of a heating susceptor 500 made from silicon carbide coated graphite. A wafer pocket 501 provides for supporting a wafer during processing within a process module (illustratively shown as structure 502). A susceptor support 503 (only one of three is illustrated) is used to support the susceptor 500. A wafer lift pin 504 is used to lift and lower wafers within and out of the pocket 501. A heater "pigtail" 505 represents a tube or bellows to encase leadwires that connect to the heater assembly 506. The leadwires extend through a metal bellows 505a which pass through the structure 502 by way of an electrical vacuum feedthrough 505b. A backplate 507 connects to the susceptor 500 through a series of clamps 508 (only one of six shown) and shield mounting screws 508a. A heater pinch off tube 509 provides for injecting and sealing gas within the heater 506. A backside gas distribution hole 510 extends through the backplate 507 and the susceptor 500 so as to couple gas and/or pressure to the wafer within the pocket 501. A thermocouple 511 measures heater temperature; and a leadout 511a connects through the structure 502 via a thermocouple vacuum feedthrough 511b so that the heater temperature is monitored external to the structure 502.

FIG. 8A shows a top view of the heating susceptor 500 of FIG. 8. FIG. 8A additionally shows the heat shield 512 and one geometric layout of the pigtail 505 and thermocouple 511.

FIGS. 8B, 8C and 8D show, in cross-sectional side views, certain details of a heating susceptor constructed according to the invention. Specifically, these figures illustrate construction of a susceptor 520, susceptor backplate 520a, heater top plate 521 (made from Hastelloy C-22), heater bottom plate 522 (made from Hastelloy C-22), thermofoil heater element 523 disposed between the plates 521, 522, heatshield 524, air gap 525 between the backplate 520a and heat shield 524, and heater pinch off tube 526, which is left open as a last step before filling the heater element 523 with inert gas and purging the system. FIG. 8B also shows a expanded view 530 of the heating element 523, which includes an Inconel resistive element 523a and mica insulators 523b. FIGS. 8C and 8D show, additionally, construction of the heater element 523, weld joints 532, the several HASTELLOY sleeves 534, reducer 536, leadwires 538 for the element 523, leadwire insulation 540, metal bellows 542, and potting cement 544 around leadwires 538.

FIG. 8E illustrates additional detail of the pigtail 505 of FIGS. 8 and 8A, including the metal bellows 550, welds 552, sleeve 554 butted to feedthrough for welding, and leadwire locations 556.

Figure 9:
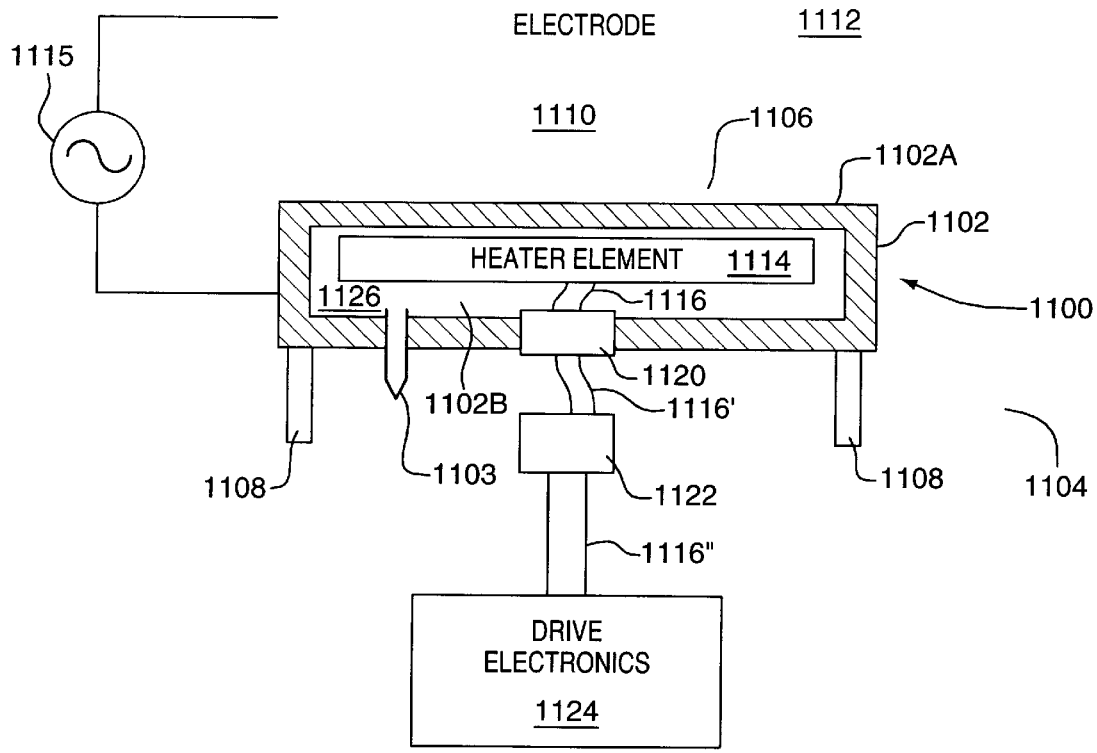
FIG. 9 illustrates a cross-sectional view of an alternative heated susceptor constructed according to the invention and shown within a process chamber.

FIG. 9 shows one heated susceptor 1100 constructed according to the invention. The susceptor 1100 includes an electrode structure 1102 which forms one of the electrodes within a processing chamber 1104, e.g., a CVD, PVD or etch reactor. The electrode structure 1102 has a substantially flat top 1102a for supporting the workpiece, shown illustratively as outline 1106. The electrode structure 1102 is suspended within the chamber 1104 on top of mount 1108 so as to form a gap 1110 with the second electrode 1112. The mount 1108 is generally configured as part of a linear drive subsystem, known to those skilled in the art, to raise and lower the susceptor 1100 so as to load wafers 1106 and to change the dimensions of the gap 1110.

In operation, for example, the electrodes 1102, 1112 are coupled to an RF generator 1115 to generate RF discharges within the gap 1110. Such discharges are used in certain embodiments of the invention to ionize gas during plasma CVD, PVD or etch.

The electrode structure further forms a hermetically sealed hollow interior 1102b; and a heating element 1114 is disposed within the interior 1102b. The heating element 1114, described in more detail below, is responsive to applied voltage to radiate heat within the interior 1102b. The heating element 1114 is coupled to lead outs 1116 which pass through the electrode structure 1102 via an electrical feedthrough 1120. The lead-outs 1116' further connect through the chamber 1104 via electrical feedthrough 1122 so as to couple the heating element 1114 to drive electronics 1124 that are external to the chamber 1104.

A thermally conductive inert gas 1126 is disposed within the interior 1102b to transfer thermal energy from the element 1114 to the electrode structure, thereby heating the electrode. Alternatively, ambient air can be disposed within the interior 1102b to achieve the same effect, though with less conductivity. In either case, a pinch-off tube 1103 is used to inject the gas therein; wherein after the tube 1103 is closed to maintain the hermetic seal.

Figure 9A:
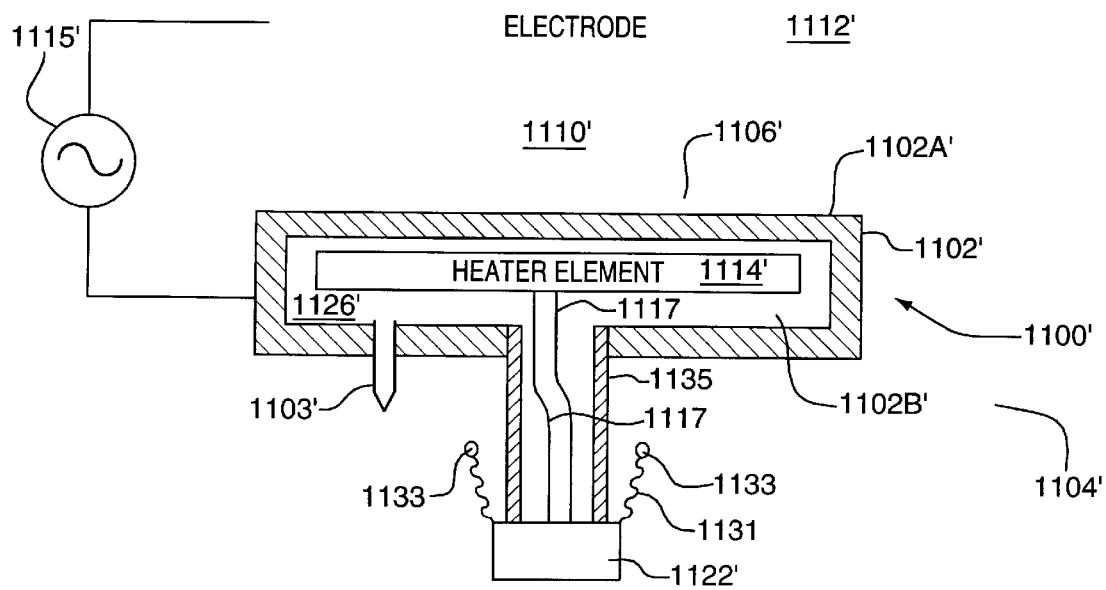
FIG. 9A illustrates a cross-sectional view of an alternative to the heated susceptor configuration of FIG. 9.

FIG. 9A shows a variation to the heated susceptor and chamber configuration of FIG. 9. In particular, a metal bellows 1131 is used to de-couple the susceptor 1100' from the chamber 1104' so that the susceptor 1100' is more easily moved, vertically, to change the gap 1110' and to load and unload wafers 1106'. Seals 1133 ensure that the bellows 1131 connects hermetically to the chamber walls 1104'. The susceptor structure 1102' in this configuration can thus include a central shaft 1135 for support and for coupling to an associated linear drive subsystem (not shown) to mechanize the vertical movement of the susceptor 1100'. The lead-outs 1117 used to drive the heater element 1114' can thus connect directly from the heater element 1114' to the feed-through 1122'. Drive electronics (not shown), such as the electronics 1124 of FIG. 9, couple to the lead-outs 1117 to control the heater element 1114'.

The heater elements 1114, 1114' of FIGS. 9 and 9A can be constructed as the heater 74 of FIG. 4 or as other heaters of the prior art.

The invention thus attains the objects set forth above, among those apparent from preceding description. Since certain changes may be made in the above apparatus and methods without departing from the scope of the invention, it is intended that all matter contained in the above description or shown in the accompanying drawing be interpreted as illustrative and not in a limiting sense.

It is also to be understood that the following claims are to cover all generic and specific features of the invention described herein, and all statements of the scope of the invention which, as a matter of language, might be said to fall there between.

Having described the invention, what is claimed is:

1. An encapsulated heater for heating a susceptor within a process module, comprising:
    an electrically resistive heating element being responsive to applied voltage to radiate heat;
    a hermetically-sealed housing for enclosing the element; and
    a gas disposed within the housing at a prescribed pressure for transferring thermal energy from the element to the housing and for preventing oxidation of the heating element, the prescribed pressure reducing differential pressure between inside and outside of the housing while maintaining sufficient thermal conductivity through the gas wherein the housing radiates and conducts heat to the susceptor.

2. A heater according to claim 1, further comprising a feed-through within the housing for connecting the heating element to a voltage source while maintaining the hermetic seal of the housing.

3. A heater according to claim 1, wherein the resistive element comprises an Inconel trace.

4. A heater according to claim 1, wherein the resistive element is made from electrically resistant material selected from the group of Inconel, nichrome, nickel-chromium, nickel-chromium-iron, nickel-chromium-aluminum alloy, molybdenum, platinum, tantelum, tungsten, silicon carbide, molybdenum disilicide and graphite.

5. A heater according to claim 1, further comprising an insulator to electrically isolate the resistive element from the housing.

6. A heater according to claim 5, wherein the insulator is selected from the group of mica, boron nitride, aluminum nitride and alumina.

7. A heater according to claim 5, wherein the insulator comprises two layers of mica, the resistive element being sandwiched between the layers.

8. A heater according to claim 1, wherein the housing comprises a metal that can be welded.

9. A heater according to claim 8, wherein the material is selected from the group consisting essentially of 316L SS, 304L SS, Hastelloy, and 304L SS coated with nickel.

10. A heater according to claim 8, wherein the metal is selected from a nickel-base alloy that is selected from the group consisting essentially of Alloy, Alloy 230, Alloy C-22, Alloy 600, Alloy C-276, Alloy 601, Alloy G3, Alloy 617, Alloy HX, Alloy 625, Alloy S, Alloy 690, Alloy W, Alloy 718, Alloy X, Alloy X750, Alloy 751, and Alloy MA 754.

11. A heater according to claim 1, wherein the prescribed pressure is approximately 150 Torr.

12. A heater according to claim 1, wherein the gas comprises an inert gas.

13. A heater according to claim 12, wherein the inert gas comprises one of helium, argon and nitrogen.

14. A heater according to claim 1, further comprising a pinch-off tube connected to the housing for romoving unwanted oxygen, for injecting the gas therein, and for sealing the gas within the housing.

15. A heater according to claim 1, further comprising electrical lead-outs connected to the heating element for driving the heating element and feedthrough means for connecting the lead-outs through the housing to an external voltage source.

16. A heater according to claim 15, wherein the feedthrough means comprises flexible hermetic metal bellows, the bellows having a proximal end connected with the housing and a distal end for connecting with external electrical connections.

17. A heater according to claim 16, further comprising an electrical end connector coupled to the distal end.

18. A heating susceptor for heating a workpiece within a processing chamber, comprising:
    a susceptor structure having a substantially flat top for supporting the workpiece within the chamber, the susceptor structure forming a hollow interior;
    a heater disposed within the interior and having a housing and an electrically resistive element, the element being hermetically sealed within the housing and being responsive to applied voltage for radiating heat within the housing; and
    a gas disposed within the housing for transferring thermal energy from the element to the housing thereby heating the interior.

19. A heating susceptor according to claim 18, wherein the susceptor structure is constructed and arranged with an aperture sized to permit installation and replacement of the heater within the interior.

20. A heating susceptor according to claim 19, further comprising a cover for substantially filling the aperture, wherein the cover and the susceptor structure substantially enclose the heater within the interior.

21. A heating susceptor according to claim 19, wherein the susceptor structure 11 and cover are formed of substantially the same material.

22. A heating susceptor according to claim 18, wherein the susceptor structure is made from material having an emissivity of at least 0.9.

23. A heating susceptor according to claim 18, wherein the susceptor structure is made from material having a thermal conductivity of at least 100 W/m–°C.

24. A heating susceptor according to claim 18, wherein the susceptor structure is made from material having a thermal coefficient of expansion of at most $3 \times 10^{-6}$/°C.

25. A heating susceptor according to claim 18, wherein the susceptor structure is formed from silicon carbide coated graphite.

26. A heating susceptor according to claim 18, wherein the susceptor structure comprises a nickel-base alloy for resisting corrosion.

27. A heating susceptor according to claim 26, wherein the nickel-base alloy is selected from the group of Alloy, Alloy 230, Alloy C-22, Alloy 600, Alloy C-276, Alloy 601, Alloy G3, Alloy 617, Alloy HX, Alloy 625, Alloy S, Alloy 690, Alloy W, Alloy 718, Alloy X, Alloy X750, Alloy 751, Hastelloy and Alloy MA 754.

28. A heating susceptor according to claim 18, wherein the resistive element comprises an Inconel trace.

29. A heating susceptor according to claim 18, wherein the resistive element is made from electrically resistant material selected from the group of Inconel, nichrome, nickel-chromium, nickel-chromium-iron, nickel-chromium-aluminum alloy, molybdenum, platinum, tantelum, tungsten, silicon carbide, molybdenum disilicide and graphite.

30. A heating susceptor according to claim 18, further comprising an insulator to electrically isolate the resistive element from the housing.

31. A heating susceptor according to claim 30, wherein the insulator comprises one of mica, boron nitride, aluminum nitride and alumina.

32. A heating susceptor according to claim 30, wherein the insulator comprises two layers of mica, the resistive element being sandwiched between the layers.

33. A heating susceptor according to claim 18, wherein the gas pressurizes within the housing to a prescribed pressure which reduces differential pressure between inside and outside of the housing while maintaining sufficient thermal conductivity through the gas wherein the housing radiates and conducts heat to the structure.

34. A heating susceptor according to claim 33, wherein the prescribed pressure is about 150 Torr.

35. A heating susceptor according to claim 18, wherein the gas comprises an inert gas.

36. A heating susceptor according to claim 35, wherein the inert gas comprises one of helium, argon and nitrogen.

37. A heating susceptor according to claim 18, further comprising a pinch-off tube connected to the housing for removing unwanted oxygen, for injecting the gas therein, and for sealing the gas within the housing.

38. A heating susceptor according to claim 18, further comprising electrical leadouts connected to the heating element and feedthroughs for coupling the lead-outs through the susceptor structure.

* * * * *